United States Patent
Seiler et al.

(10) Patent No.: US 10,605,838 B2
(45) Date of Patent: Mar. 31, 2020

(54) SYSTEM AND METHOD FOR SUBMETERING OF A HEATING, VENTILATION, AND/OR AIR CONDITIONING (HVAC) SYSTEM

(71) Applicant: Johnson Controls Technology Company, Milwaukee, WI (US)

(72) Inventors: Aron M. Seiler, White Hall, MD (US); Philip G. Smyth, York, PA (US); Rajiv K. Karkhanis, York, PA (US)

(73) Assignee: Johnson Controls Technology Company, Auburn Hills, MI (US)

( * ) Notice: Subject to any disclaimer, the term of this patent is extended or adjusted under 35 U.S.C. 154(b) by 49 days.

(21) Appl. No.: 15/710,621

(22) Filed: Sep. 20, 2017

(65) Prior Publication Data

US 2018/0100882 A1     Apr. 12, 2018

Related U.S. Application Data

(60) Provisional application No. 62/406,313, filed on Oct. 10, 2016.

(51) Int. Cl.
| | | |
|---|---|---|
| *G01R 21/133* | (2006.01) | |
| *G01R 21/00* | (2006.01) | |
| *F24F 11/30* | (2018.01) | |
| *F24F 11/46* | (2018.01) | |
| *F25B 49/02* | (2006.01) | |

(Continued)

(52) U.S. Cl.
CPC .......... *G01R 21/1331* (2013.01); *F24F 11/30* (2018.01); *F24F 11/46* (2018.01); *G01R 21/005* (2013.01); *F24F 2110/10* (2018.01); *F24F 2110/50* (2018.01); *F25B 49/025* (2013.01); *G01R 21/1333* (2013.01)

(58) Field of Classification Search
CPC ............... G01R 21/005; G01R 21/1331; F24F 11/0012; F24F 11/30; F24F 11/46; F24F 2110/10; F24F 2110/50; F25B 49/025; G05B 15/02; G05B 2219/2642
See application file for complete search history.

(56) References Cited

U.S. PATENT DOCUMENTS 4,308,992 A *   1/1982   Horton .................. F24F 3/0442
                                                                    165/11.1
4,578,958 A *   4/1986   Reuter ................ F24D 19/1084
                                                                    62/126
(Continued)

FOREIGN PATENT DOCUMENTS

| WO | 2011103652 A1 | 9/2011 |
|---|---|---|
| WO | 2013140279 A1 | 9/2013 |
| WO | 2017139214 A1 | 8/2017 |

*Primary Examiner* — Chun Cao
(74) *Attorney, Agent, or Firm* — Fletcher Yoder, P.C.

(57) ABSTRACT

In an embodiment of the present disclosure, a method for determining power consumption of a unit of a heating, ventilating, and air conditioning (HVAC) system includes providing conditioned air to the unit from an HVAC unit of the HVAC system. The method also includes receiving power data indicative of a total power consumed by the HVAC unit, receiving airflow data indicative of a rate of the conditioned air received by the unit from the HVAC unit, determining a power consumption of the unit based on the power data and the airflow data, and outputting the power consumption of the unit.

24 Claims, 8 Drawing Sheets

(51) Int. Cl.
*F24F 110/50* (2018.01)
*F24F 110/10* (2018.01)

(56) References Cited

U.S. PATENT DOCUMENTS

| | | | |
|---|---|---|---|
| 6,990,821 B2 | 1/2006 | Singh et al. | |
| 7,818,270 B2 | 10/2010 | Carey et al. | |
| 7,891,573 B2* | 2/2011 | Finkam | F24F 11/74 236/49.3 |
| 8,799,205 B2 | 8/2014 | Shetty et al. | |
| 8,983,670 B2 | 3/2015 | Shetty et al. | |
| 9,016,593 B2 | 4/2015 | Metselaar | |
| 9,046,900 B2 | 6/2015 | Kates | |
| 9,235,657 B1* | 1/2016 | Wenzel | G06F 17/50 |
| 9,292,013 B2 | 3/2016 | Keil et al. | |
| 9,459,015 B2 | 10/2016 | Karamanos et al. | |
| 2010/0298993 A1* | 11/2010 | Eaton | H01R 13/6456 700/282 |
| 2012/0125558 A1* | 5/2012 | Nortman | G01F 1/68 165/11.1 |
| 2013/0035794 A1 | 2/2013 | Imani | |
| 2013/0331999 A1 | 12/2013 | Vaughn et al. | |
| 2014/0032506 A1 | 1/2014 | Hoey et al. | |
| 2014/0279712 A1 | 9/2014 | Ortner | |
| 2014/0303789 A1 | 10/2014 | Wroblewski et al. | |
| 2014/0339316 A1 | 11/2014 | Barooah et al. | |
| 2015/0045960 A1 | 2/2015 | Caron et al. | |
| 2015/0178421 A1 | 6/2015 | Borrelli et al. | |
| 2015/0178865 A1 | 6/2015 | Anderson et al. | |
| 2015/0316903 A1* | 11/2015 | Asmus | G06Q 10/04 700/291 |
| 2015/0338314 A1* | 11/2015 | Meyer | G01M 99/005 73/40 |
| 2016/0025578 A1 | 1/2016 | Meirav et al. | |
| 2016/0313018 A1 | 10/2016 | Leeland et al. | |
| 2016/0313753 A1 | 10/2016 | Liu | |
| 2016/0377309 A1* | 12/2016 | Abiprojo | G05B 19/042 700/276 |

* cited by examiner

| TENANT | VAV BOX | AIRFLOW MEASUREMENT (CFM) | AIRFLOW PERCENTAGE | POWER CONSUMPTION (W) |
|---|---|---|---|---|
| A1 | 1 | 2134 | 6% | 9033.01 |
| A2 | 2 | 9843 | 27% | 41664.42 |
| A3 | 3 | 1987 | 5% | 8410.77 |
| A4 | 4 | 2948 | 8% | 12478.59 |
| B1 | 5 | 1918 | 5% | 8118.70 |
| B2 | 6 | 2756 | 8% | 11665.87 |
| B3 | 7 | 4519 | 12% | 19128.47 |
| C1 | 8 | 3159 | 9% | 13371.73 |
| C2 | 9 | 3345 | 9% | 14159.05 |
| C3 | 10 | 4055 | 11% | 17164.40 |
| POWER CONSUMPTION MEASUREMENT: | | 155195 | | |
| TOTAL AIRFLOW: | | 36664 | | |

FIG. 7

SYSTEM AND METHOD FOR SUBMETERING OF A HEATING, VENTILATION, AND/OR AIR CONDITIONING (HVAC) SYSTEM

CROSS REFERENCE TO RELATED APPLICATION

This application is a Non-Provisional application claiming priority to U.S. Provisional Application No. 62/406,313, entitled "METERLESS HVAC SUBMETERING," filed Oct. 10, 2016, which is hereby incorporated by reference in its entirety for all purposes.

BACKGROUND

The present disclosure relates generally to heating, ventilating, and air conditioning (HVAC) systems and, more particularly, to systems and methods for metering compartmentalized power consumption of an HVAC system.

A wide range of applications exists for HVAC systems. For example, residential, light commercial, commercial, and industrial systems are used to control temperatures and air quality in indoor environments and buildings. Generally, HVAC systems may administer conditioned air through variable air volume (VAV) boxes into units (e.g., rooms) of a building to control the temperature of the units to individualized set-point temperatures. To monitor the rate of power consumption and overall power consumption of each VAV box, an energy meter may be installed on each VAV box of an HVAC system. However, energy meters may be expensive and consume unnecessary amounts of energy to operate.

SUMMARY

In one embodiment of the present disclosure, a heating, ventilating, and air conditioning (HVAC) system is configured to supply conditioned air to a unit of a building. The HVAC system includes an HVAC unit, an energy meter, an airflow meter, and a metering system. The HVAC unit is configured to supply the conditioned air through a duct system to the unit of the building. The energy meter is configured to measure a power measurement indicative of power consumed by the HVAC unit. The airflow meter is configured to measure a rate of flow measurement indicative of a rate of flow of the conditioned air supplied to the unit of the building. The metering system is configured to determine an individualized power consumption for the unit of the building based on the rate of flow of the conditioned air that is supplied to the unit and the power consumed by the HVAC unit.

In another embodiment of the present disclosure, a method for determining power consumption of a unit of a heating, ventilating, and air conditioning (HVAC) system includes providing conditioned air to the unit from an HVAC unit of the HVAC system. The method also includes receiving power data indicative of a total power consumed by the HVAC unit, receiving airflow data indicative of a rate of the conditioned air received by the unit from the HVAC unit, determining a power consumption of the unit based on the power data and the airflow data, and outputting the power consumption of the unit.

In a further embodiment of the present disclosure, a heating, ventilating, and air conditioning (HVAC) system includes an HVAC unit configured to supply conditioned air to a unit of a building and a metering system configured to determine a unit power consumption of the unit. The metering system includes a processor and a non-transitory, computer-readable media having executable instructions stored thereon. The executable instructions include instructions adapted to determine the unit power consumption of the unit based on a flow rate of conditioned air received by the unit and based on an HVAC power consumption of the HVAC unit.

Other features and advantages of the present application will be apparent from the following, more detailed description of the embodiments, taken in conjunction with the accompanying drawings, which illustrate, by way of example, the principles of the application.

DRAWINGS

FIG. 7 is a chart of data and analysis that may be utilized by the control system of FIG. 6, in accordance with an embodiment of the present disclosure.

DETAILED DESCRIPTION

The present disclosure is directed to heating, ventilating, and air conditioning (HVAC) systems that are configured to monitor or meter power consumption of individual variable air volume (VAV) boxes of a building. In some embodiments, an HVAC system, such as a roof top unit or air handling unit, may supply various amounts of air through VAV boxes to units of a building. For example, each VAV box may supply an air stream to the respective unit is services according to a predetermined set-point temperature of each unit. As used herein, a "unit" of a building may refer to a room, floor, level, apartment, or other subdivided space within the building. To determine power consumption of each unit, a supervisory controller may compare airflows of each VAV box to a total airflow of all of the VAV boxes that are provided with air by the HVAC unit. In this manner, the airflow of each unit may be expressed as a percentage relative to the total airflow of the HVAC system. The supervisory controller may then compare the airflow percentages of each unit to a total power consumption of the HVAC system to obtain a measure of the power consumption of each unit.

Figure 1:
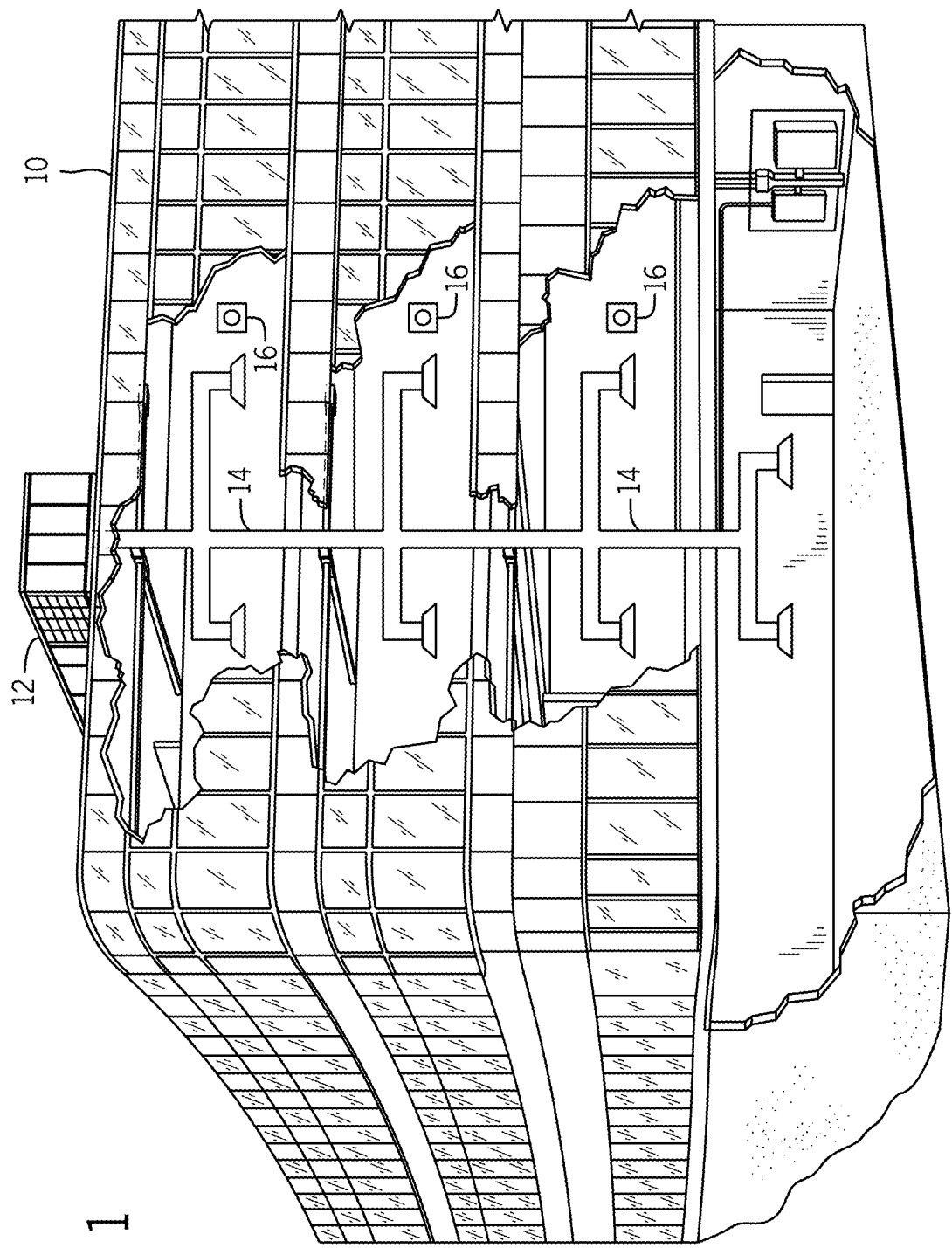
FIG. 1 is a perspective view of a heating, ventilating, and air conditioning (HVAC) system for building environmental management that may employ one or more HVAC units, in accordance with an embodiment of the present disclosure.

Turning now to the drawings, FIG. 1 illustrates a heating, ventilating, and air conditioning (HVAC) system for building environmental management that may employ one or more HVAC units. In the illustrated embodiment, a building 10 is air conditioned by a system that includes an HVAC unit 12. The building 10 may be a commercial structure or a residential structure. As shown, the HVAC unit 12 is disposed on the roof of the building 10; however, the HVAC unit 12 may be located in other equipment rooms or areas adjacent the building 10. The HVAC unit 12 may be a single package unit containing other equipment, such as a blower, integrated air handler, and/or auxiliary heating unit. In other embodiments, the HVAC unit 12 may be part of a split HVAC system, such as the system shown in FIG. 3, which includes an outdoor HVAC unit 58 and an indoor HVAC unit 56.

The HVAC unit 12 is an air cooled device that implements a refrigeration cycle to provide conditioned air to the building 10. Specifically, the HVAC unit 12 may include one or more heat exchangers across which an airflow is passed to condition the airflow before the airflow is supplied to the building. In the illustrated embodiment, the HVAC unit 12 is a rooftop unit (RTU) that conditions a supply air stream, such as environmental air and/or a return airflow from the building 10. After the HVAC unit 12 conditions the air, the air is supplied to the building 10 via ductwork 14 extending throughout the building 10 from the HVAC unit 12. For example, the ductwork 14 may extend to various individual floors or other sections of the building 10. In certain embodiments, the HVAC unit 12 may be a heat pump that provides both heating and cooling to the building with one refrigeration circuit configured to operate in different modes. In other embodiments, the HVAC unit 12 may include one or more refrigeration circuits for cooling an air stream and a furnace for heating the air stream.

A control device 16, one type of which may be a thermostat, may be used to designate the temperature of the conditioned air. The control device 16 also may be used to control the flow of air through the ductwork 14. For example, the control device 16 may be used to regulate operation of one or more components of the HVAC unit 12 or other components, such as dampers and fans, within the building 10 that may control flow of air through and/or from the ductwork 14. In some embodiments, other devices may be included in the system, such as pressure and/or temperature transducers or switches that sense the temperatures and pressures of the supply air, return air, and so forth. Moreover, the control device 16 may include computer systems that are integrated with or separate from other building control or monitoring systems, and even systems that are remote from the building 10.

Figure 2:
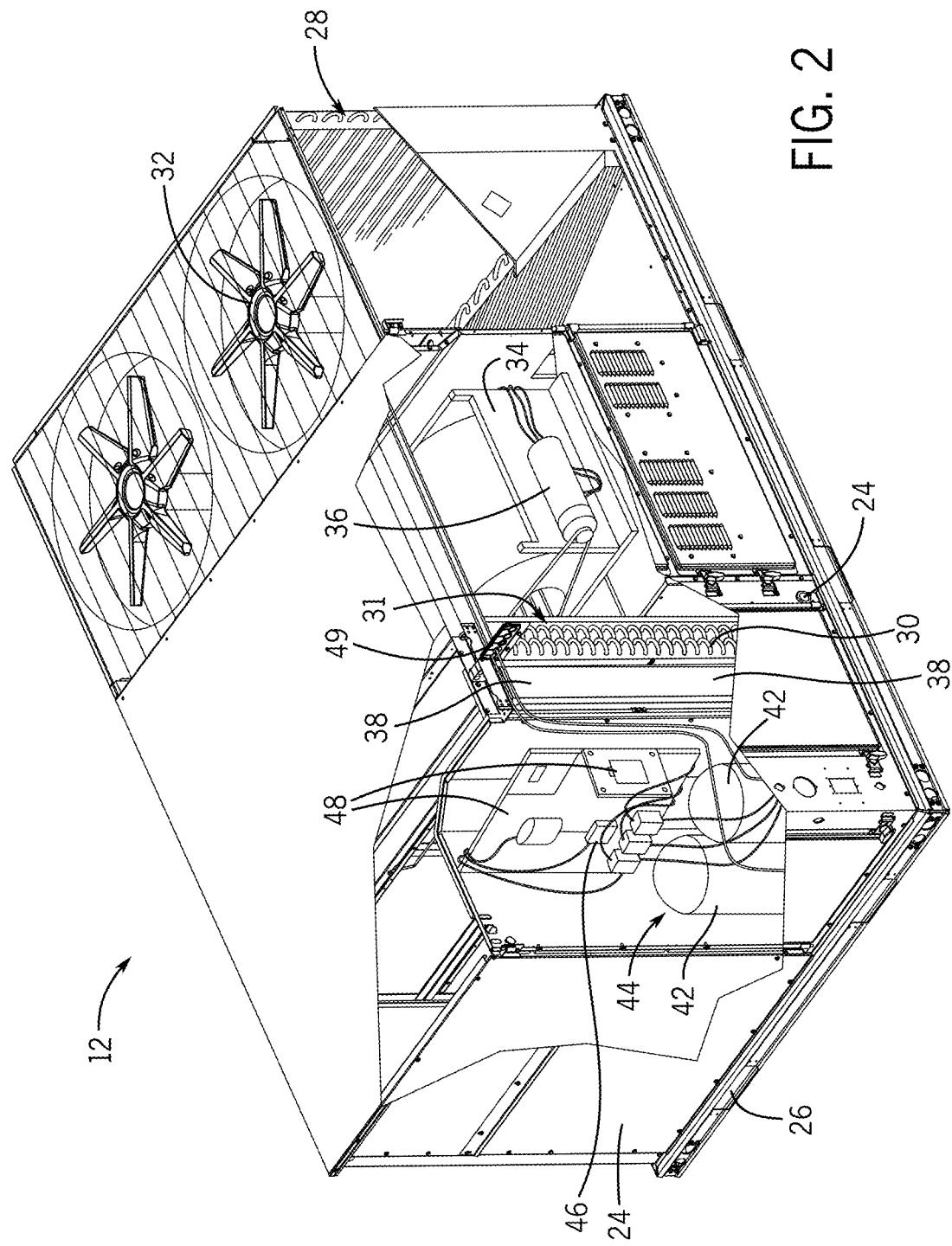
FIG. 2 is a perspective view of an HVAC unit of the HVAC system of FIG. 1, in accordance with an embodiment of the present disclosure.

FIG. 2 is a perspective view of an embodiment of the HVAC unit 12. In the illustrated embodiment, the HVAC unit 12 is a single package unit that may include one or more independent refrigeration circuits and components that are tested, charged, wired, piped, and ready for installation. The HVAC unit 12 may provide a variety of heating and/or cooling functions, such as cooling only, heating only, cooling with electric heat, cooling with dehumidification, cooling with gas heat, or cooling with a heat pump. As described above, the HVAC unit 12 may directly cool and/or heat an air stream provided to the building 10 to condition a space in the building 10.

As shown in the illustrated embodiment of FIG. 2, a cabinet 24 encloses the HVAC unit 12 and provides structural support and protection to the internal components from environmental and other contaminants. In some embodiments, the cabinet 24 may be constructed of galvanized steel and insulated with aluminum foil faced insulation. Rails 26 may be joined to the bottom perimeter of the cabinet 24 and provide a foundation for the HVAC unit 12. In certain embodiments, the rails 26 may provide access for a forklift and/or overhead rigging to facilitate installation and/or removal of the HVAC unit 12. In some embodiments, the rails 26 may fit into "curbs" on the roof to enable the HVAC unit 12 to provide air to the ductwork 14 from the bottom of the HVAC unit 12 while blocking elements such as rain from leaking into the building 10.

The HVAC unit 12 includes heat exchangers 28 and 30 in fluid communication with one or more refrigeration circuits. Tubes within the heat exchangers 28 and 30 may circulate refrigerant (for example, R-410A, steam, or water) through the heat exchangers 28 and 30. The tubes may be of various types, such as multichannel tubes, conventional copper or aluminum tubing, and so forth. Together, the heat exchangers 28 and 30 may implement a thermal cycle in which the refrigerant undergoes phase changes and/or temperature changes as it flows through the heat exchangers 28 and 30 to produce heated and/or cooled air. For example, the heat exchanger 28 may function as a condenser where heat is released from the refrigerant to ambient air, and the heat exchanger 30 may function as an evaporator where the refrigerant absorbs heat to cool an air stream. In other embodiments, the HVAC unit 12 may operate in a heat pump mode where the roles of the heat exchangers 28 and 30 may be reversed. That is, the heat exchanger 28 may function as an evaporator and the heat exchanger 30 may function as a condenser. In further embodiments, the HVAC unit 12 may include a furnace for heating the air stream that is supplied to the building 10. While the illustrated embodiment of FIG. 2 shows the HVAC unit 12 having two of the heat exchangers 28 and 30, in other embodiments, the HVAC unit 12 may include one heat exchanger or more than two heat exchangers.

The heat exchanger 30 is located within a compartment 31 that separates the heat exchanger 30 from the heat exchanger 28. Fans 32 draw air from the environment through the heat exchanger 28. Air may be heated and/or cooled as the airflows through the heat exchanger 28 before being released back to the environment surrounding the rooftop unit 12. A blower assembly 34, powered by a motor 36, draws air through the heat exchanger 30 to heat or cool the air. The heated or cooled air may be directed to the building 10 by the ductwork 14, which may be connected to the HVAC unit 12. Before flowing through the heat exchanger 30, the conditioned airflows through one or more filters 38 that may remove particulates and contaminants from the air. In certain embodiments, the filters 38 may be disposed on the air intake side of the heat exchanger 30 to prevent contaminants from contacting the heat exchanger 30.

The HVAC unit 12 also may include other equipment for implementing the thermal cycle. Compressors 42 increase the pressure and temperature of the refrigerant before the refrigerant enters the heat exchanger 28. The compressors 42 may be any suitable type of compressors, such as scroll compressors, rotary compressors, screw compressors, or reciprocating compressors. In some embodiments, the compressors 42 may include a pair of hermetic direct drive compressors arranged in a dual stage configuration 44. However, in other embodiments, any number of the compressors 42 may be provided to achieve various stages of heating and/or cooling. As may be appreciated, additional equipment and devices may be included in the HVAC unit 12, such as a solid-core filter drier, a drain pan, a disconnect switch, an economizer, pressure switches, phase monitors, and humidity sensors, among other things.

The HVAC unit 12 may receive power through a terminal block 46. For example, a high voltage power source may be connected to the terminal block 46 to power the equipment. The operation of the HVAC unit 12 may be governed or regulated by a control board 48. The control board 48 may include control circuitry connected to a thermostat, sensors, and alarms (one or more being referred to herein separately or collectively as the control device 16). The control circuitry may be configured to control operation of the equipment, provide alarms, and monitor safety switches. Wiring 49 may connect the control board 48 and the terminal block 46 to the equipment of the HVAC unit 12.

Figure 3:
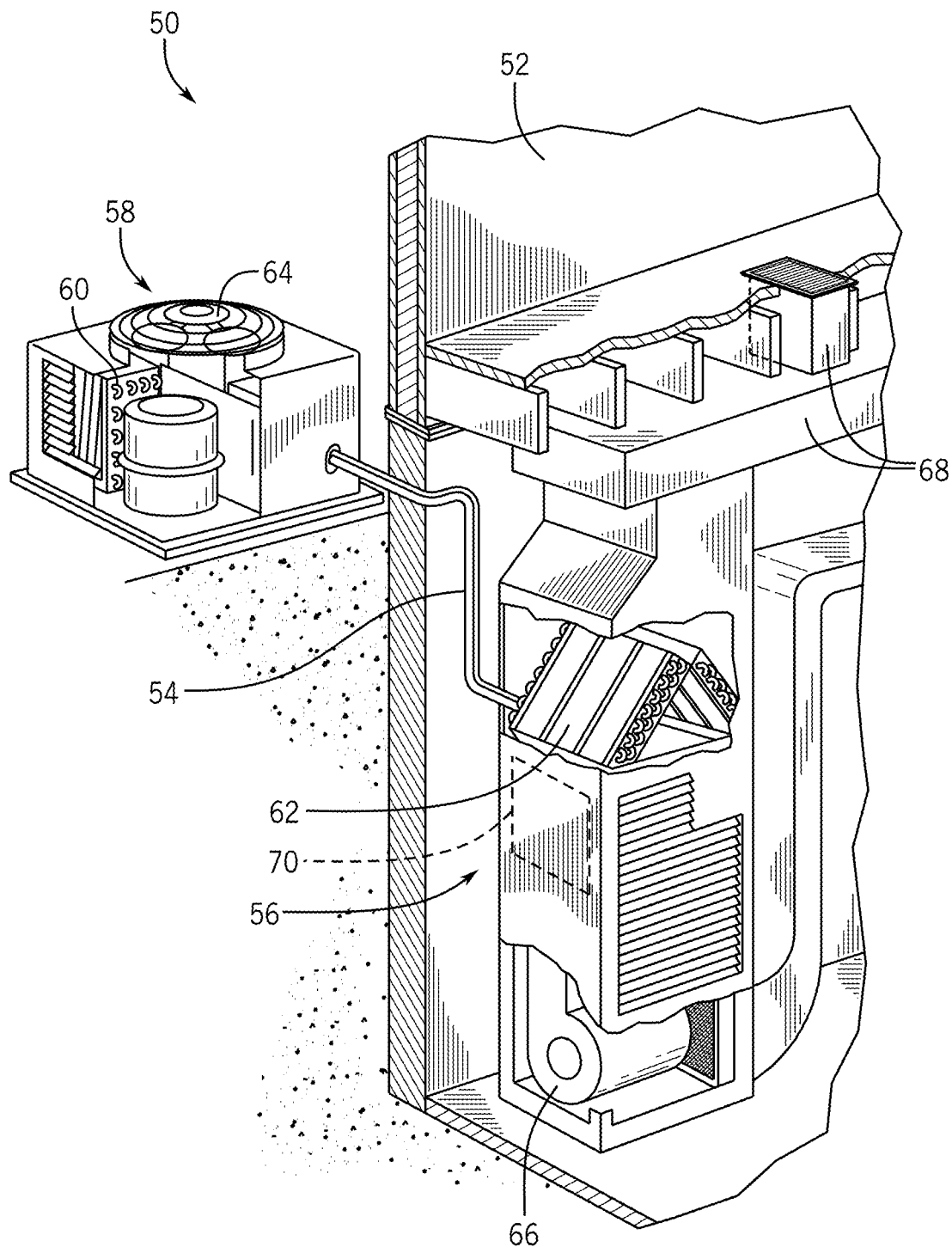
FIG. 3 is a perspective view of a residential split heating and cooling system, in accordance with an embodiment of the present disclosure.

FIG. 3 illustrates a residential heating and cooling system 50, also in accordance with present techniques. The residential heating and cooling system 50 may provide heated and cooled air to a residential structure, as well as provide outside air for ventilation and provide improved indoor air quality (IAQ) through devices such as ultraviolet lights and air filters. In the illustrated embodiment, the residential heating and cooling system 50 is a split HVAC system. In general, a residence 52 conditioned by a split HVAC system may include refrigerant conduits 54 that operatively couple the indoor unit 56 to the outdoor unit 58. The indoor unit 56 may be positioned in a utility room, an attic, a basement, and so forth. The outdoor unit 58 is typically situated adjacent to a side of residence 52 and is covered by a shroud to protect the system components and to prevent leaves and other debris or contaminants from entering the unit. The refrigerant conduits 54 transfer refrigerant between the indoor unit 56 and the outdoor unit 58, typically transferring primarily liquid refrigerant in one direction and primarily vaporized refrigerant in an opposite direction.

When the system shown in FIG. 3 is operating as an air conditioner, a heat exchanger 60 in the outdoor unit 58 serves as a condenser for re-condensing vaporized refrigerant flowing from the indoor unit 56 to the outdoor unit 58 via one of the refrigerant conduits 54. In these applications, a heat exchanger 62 of the indoor unit functions as an evaporator. Specifically, the heat exchanger 62 receives liquid refrigerant (which may be expanded by an expansion device, not shown) and evaporates the refrigerant before returning it to the outdoor unit 58.

The outdoor unit 58 draws environmental air through the heat exchanger 60 using a fan 64 and expels the air above the outdoor unit 58. When operating as an air conditioner, the air is heated by the heat exchanger 60 within the outdoor unit 58 and exits the unit at a temperature higher than it entered. The indoor unit 56 includes a blower or fan 66 that directs air through or across the indoor heat exchanger 62, where the air is cooled when the system is operating in air conditioning mode. Thereafter, the air is passed through ductwork 68 that directs the air to the residence 52. The overall system operates to maintain a desired temperature as set by a system controller. When the temperature sensed inside the residence 52 is higher than the set point on the thermostat (plus a small amount), the residential heating and cooling system 50 may become operative to refrigerate additional air for circulation through the residence 52. When the temperature reaches the set point (minus a small amount), the residential heating and cooling system 50 may stop the refrigeration cycle temporarily.

The residential heating and cooling system 50 may also operate as a heat pump. When operating as a heat pump, the roles of heat exchangers 60 and 62 are reversed. That is, the heat exchanger 60 of the outdoor unit 58 will serve as an evaporator to evaporate refrigerant and thereby cool air entering the outdoor unit 58 as the air passes over outdoor the heat exchanger 60. The indoor heat exchanger 62 will receive a stream of air blown over it and will heat the air by condensing the refrigerant.

In some embodiments, the indoor unit 56 may include a furnace system 70. For example, the indoor unit 56 may include the furnace system 70 when the residential heating and cooling system 50 is not configured to operate as a heat pump. The furnace system 70 may include a burner assembly and heat exchanger, among other components, inside the indoor unit 56. Fuel is provided to the burner assembly of the furnace 70 where it is mixed with air and combusted to form combustion products. The combustion products may pass through tubes or piping in a heat exchanger (that is, separate from heat exchanger 62), such that air directed by the blower 66 passes over the tubes or pipes and extracts heat from the combustion products. The heated air may then be routed from the furnace system 70 to the ductwork 68 for heating the residence 52.

Figure 4:
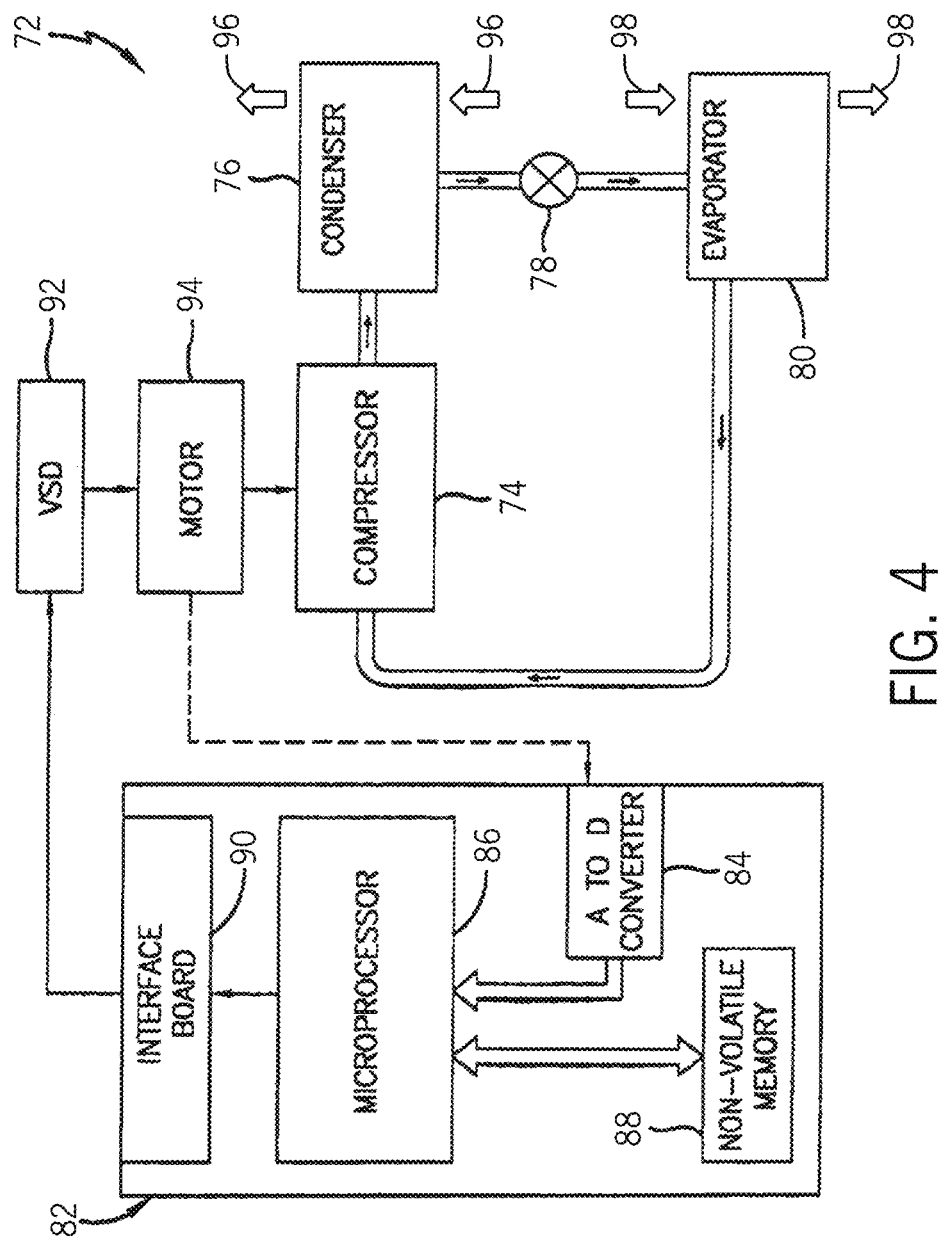
FIG. 4 is a schematic view of a vapor compression system that may be used in an HVAC system, in accordance with an embodiment of the present disclosure.

FIG. 4 is an embodiment of a vapor compression system 72 that can be used in any of the systems described above. The vapor compression system 72 may circulate a refrigerant through a circuit starting with a compressor 74. The circuit may also include a condenser 76, an expansion valve(s) or device(s) 78, and an evaporator 80. The vapor compression system 72 may further include a control panel 82 that has an analog to digital (A/D) converter 84, a microprocessor 86, a non-volatile memory 88, and/or an interface board 90. The control panel 82 and its components may function to regulate operation of the vapor compression system 72 based on feedback from an operator, from sensors of the vapor compression system 72 that detect operating conditions, and so forth.

In some embodiments, the vapor compression system 72 may use one or more of a variable speed drive (VSDs) 92, a motor 94, the compressor 74, the condenser 76, the expansion valve or device 78, and/or the evaporator 80. The motor 94 may drive the compressor 74 and may be powered by the variable speed drive (VSD) 92. The VSD 92 receives alternating current (AC) power having a particular fixed line voltage and fixed line frequency from an AC power source, and provides power having a variable voltage and frequency to the motor 94. In other embodiments, the motor 94 may be powered directly from an AC or direct current (DC) power source. The motor 94 may include any type of electric motor that can be powered by a VSD or directly from an AC or DC power source, such as a switched reluctance motor, an induction motor, an electronically commutated permanent magnet motor, or another suitable motor.

The compressor 74 compresses a refrigerant vapor and delivers the vapor to the condenser 76 through a discharge passage. In some embodiments, the compressor 74 may be a centrifugal compressor. The refrigerant vapor delivered by the compressor 74 to the condenser 76 may transfer heat to a fluid passing across the condenser 76, such as ambient or environmental air 96. The refrigerant vapor may condense to a refrigerant liquid in the condenser 76 as a result of thermal heat transfer with the environmental air 96. The liquid refrigerant from the condenser 76 may flow through the expansion device 78 to the evaporator 80.

The liquid refrigerant delivered to the evaporator 80 may absorb heat from another air stream, such as a supply air stream 98 provided to the building 10 or the residence 52. For example, the supply air stream 98 may include ambient or environmental air, return air from a building, or a combination of the two. The liquid refrigerant in the evaporator 80 may undergo a phase change from the liquid refrigerant to a refrigerant vapor. In this manner, the evaporator 38 may reduce the temperature of the supply air stream 98 via thermal heat transfer with the refrigerant. Thereafter, the vapor refrigerant exits the evaporator 80 and returns to the compressor 74 by a suction line to complete the cycle.

In some embodiments, the vapor compression system 72 may further include a reheat coil in addition to the evaporator 80. For example, the reheat coil may be positioned downstream of the evaporator relative to the supply air stream 98 and may reheat the supply air stream 98 when the supply air stream 98 is overcooled to remove humidity from the supply air stream 98 before the supply air stream 98 is directed to the building 10 or the residence 52.

It should be appreciated that any of the features described herein may be incorporated with the HVAC unit 12, the residential heating and cooling system 50, or other HVAC systems. Additionally, while the features disclosed herein are described in the context of embodiments that directly heat and cool a supply air stream provided to a building or other load, embodiments of the present disclosure may be applicable to other HVAC systems as well. For example, the features described herein may be applied to mechanical cooling systems, free cooling systems, chiller systems, or other heat pump or refrigeration applications.

As discussed in detail below, HVAC systems, such as the HVAC unit 12 and the residential heating and cooling system 50, may be communicatively coupled to a controller configured to determine a power usage of individual units within a building, such as the building 10 and the residence 52. More specifically, the controller may determine the power usage of the individual units based on a comparison of airflow data associated with each of the individual units of the building 10 to a total power consumption of an HVAC unit.

Figure 5:
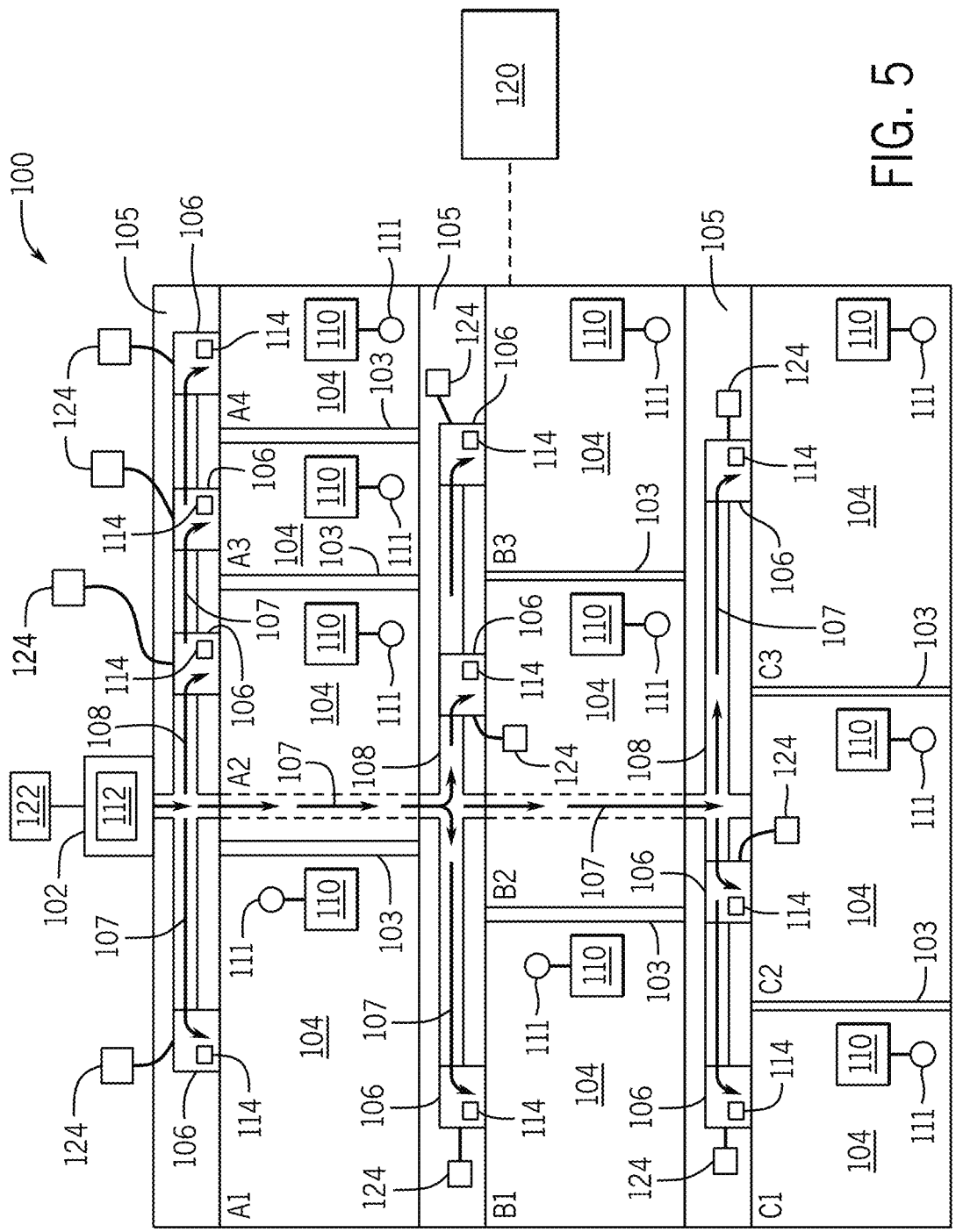
FIG. 5 is a schematic view of a building that may utilize an HVAC, in accordance with an embodiment of the present disclosure.

Keeping this in mind, FIG. 5 illustrates a building 100 with an HVAC unit 102, such as an air handling unit or rooftop unit, that supplies conditioned air to units 104 within the building 100. Each unit 104 of the building 100 may be defined as a section of the building 100 to which a particular variable air volume (VAV) box 106 supplies conditioned air from the HVAC unit 102. In some embodiments, the units 104 of the building 100 may be separated by a wall 103 and/or a floor/ceiling 105. Particularly, the HVAC unit 102 may supply air through a duct system 108 to each VAV box 106 as shown by arrows 107. The amount of air, or airflow, supplied through each VAV box 106 to the associated unit 104 may depend on a set-point temperature for the associated unit 104. For example, similar to the building 10 as described above in FIG. 1, each unit 104 of the building 100 may include a control device 110, such as a thermostat, that may receive input to designate the set-point temperature for the unit 104. In response to the set-point temperature of the unit 104, the associated VAV box 106 will supply an appropriate amount of the conditioned air from the HVAC unit 102 to the respective unit 104. To illustrate, the control device 110 may receive input for a certain set-point temperature and the VAV box 106 will provide conditioned air from the HVAC unit 102 to the unit 104 until a temperature sensor 111 communicatively coupled to the control device 110 senses that the actual temperature of the unit 104 has reached the predetermined set-point temperature. Once the actual temperature of the unit 104 has reached the set-point temperature, the VAV box 106 may continue to supply an appropriate amount of conditioned air to maintain the actual temperature at the set-point temperature.

In some embodiments, the temperature and amount of the conditioned air that the HVAC unit 102 supplies to the building 100 may be based on ambient or surrounding environment temperature and/or the set-point temperatures received from the control devices 110. Further, the HVAC unit 102 may maintain an average pressure while supplying the conditioned air 104. For example, in some embodiments, to maintain the average pressure while in operation, the HVAC unit 102 may maintain a minimum flow of conditioned air through each VAV box 106 and/or may vary the amount of raw air, such as ambient and/or return air, drawn in to be conditioned before being supplied to the building 100.

Further, the HVAC unit 102 may include an energy meter 112 to monitor the energy consumption of the HVAC unit 102 and each VAV box 106 may include an airflow meter 114 to monitor the rate of conditioned air that each unit 104 receives from the HVAC unit 102. Specifically, the energy meter 112 may gather power data indicative of the power, or instantaneous energy usage, consumed by the HVAC unit 102 and communicate the power data to a supervisory controller 120. Indeed, in some embodiments, the energy meter 112 may be a dedicated power meter. Similarly, each airflow meter 114 may gather airflow data indicative of the rate of conditioned air that flows into the unit 104 from the associated VAV box 106 and communicate the airflow data to a supervisory controller 120. Indeed, each VAV box 106 may include the airflow meter built into the VAV box 106. In some embodiments, the HVAC unit 102 may include and/or be communicatively coupled to an HVAC unit controller 122 that may process and/or gather the power data before sending the power data to the supervisory controller 120. Likewise, in some embodiments, each VAV box 106 may include and/or be communicatively coupled to a VAV box controller 124 that may process and/or gather the airflow data before sending the airflow data to the supervisory controller 120.

Figure 6:
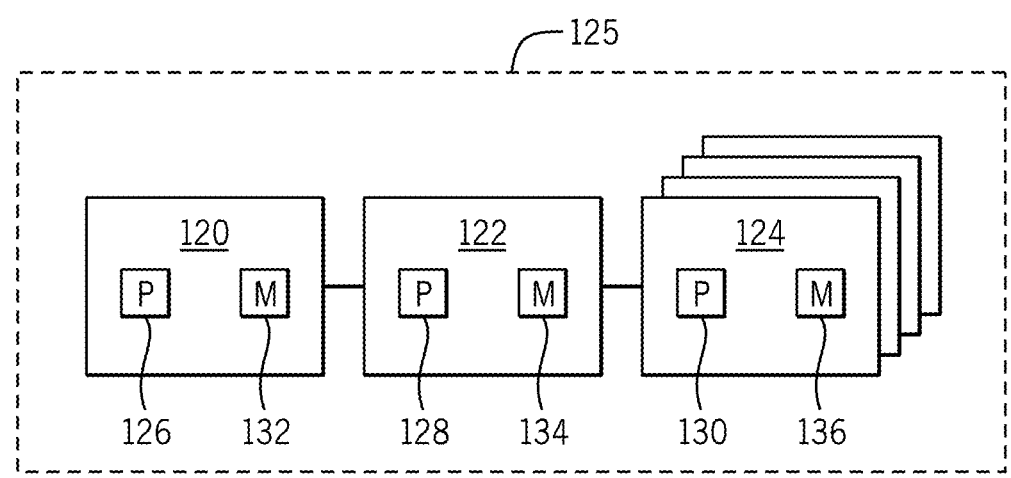
FIG. 6 is a block diagram of a control system that may be utilized by an HVAC system to determine power consumption, in accordance with an embodiment of the present disclosure.

For example, FIG. 6 includes a metering system 125 that may measure power consumption of the HVAC unit 102 and airflow of each VAV box 106 and determine the power consumption of each unit 104 based on the measurements. To this end, the metering system 125 may include the supervisory controller 120 which is communicatively coupled to the HVAC unit controller 122 and each VAV box controller 124. In some embodiments, the supervisory controller 120 may be communicatively coupled to the HVAC unit controller 122 and each VAV box controller 124 via a network, such as local area networks (LAN), wireless local area networks (WLAN), wireless wide area networks (WWAN), or near field communication (NFC). Particularly, in some embodiments, the supervisory controller 120, the HVAC unit controller 122, and each VAV box controller 124 may be communicatively coupled together via Ethernet. In some embodiments, the controllers 120, 122, 124 may utilize a serial communication protocol such as RS485 BACnet.

In the current embodiment, each VAV box controller 124 may gather and/or receive airflow data from respective airflow meters 114 and transmit the airflow data to the HVAC unit controller 122. Similarly, the HVAC unit controller 122 may gather and/or receive the power data from the energy meter 112. The HVAC unit controller 122 may then transmit both the airflow data and the power data to the supervisory controller 120 for analysis, which will be discussed in further detail below. In other words, the supervisory controller 120 may be communicatively coupled to the HVAC unit controller 122, which in turn, is communicatively coupled to each VAV box controller 124. In some embodiments, however, the supervisory controller 120 may be receive the power data directly from the HVAC unit controller 122 and receive the airflow data directly from each VAV box controller 124. In further embodiments, the VAV box controllers 124, the HVAC unit controller 122, and the supervisory controller 120 may be communicatively coupled to one another in series. For example, the HVAC unit controller 122 may receive accumulated airflow data from each VAV box controller 124 through a single VAV box controller 124, which receives the accumulated airflow data from one other VAV box controller 124, and so forth. The HVAC unit controller 122 may then transmit the accumulated airflow data, along with the gathered power data, to the supervisory controller 120 for further analysis.

The supervisory controller 120, the HVAC unit controller 122, and each VAV box controller 124 may be any devices employing processors, such as a supervisory processor 126, an HVAC unit processor 128, and a VAV box processor 130, each of which may be an application-specific processor. The supervisory controller 120, the HVAC unit controller 122, and each VAV box controller 124 may also include memory devices, such as a supervisory memory 132, an HVAC unit memory 134, and a VAV box memory 136, for storing instructions executable by the processors 126, 128, 130 to perform methods and control actions described herein relating to analysis of power consumption and air conditioning of the building 100. Each processor 126, 128, 130 may include one or more processing devices, and each memory 132, 134, 136 may include one or more tangible, non-transitory, machine-readable media. By way of example, such machine-readable media can include RAM, ROM, EPROM, EEPROM, CD-ROM, or other optical disk storage, magnetic disk storage or other magnetic storage devices, or any other medium which can be used to carry or store desired program code in the form of machine-executable instructions or data structures and which can be accessed by each respective processor 126, 128, 130 or by any general purpose or special purpose computer or other machine with a processor.

FIG. 7 is a chart that shows an example of information that the supervisory controller 120 may receive and analyze, including results of the analysis of the information. For example, FIG. 7 includes air conditioning information 140, or an input, indicative of the airflow data and power data that the supervisory controller 120 may receive and analyze. Specifically, the air conditioning information 140 may include an airflow measurement 144 of each unit 140, which is indicative of the rate of air that one of the VAV boxes 106 emits into its associated unit 104 at a particular moment in time. The airflow measurement 144 of each unit 104 may be expressed as a unit of volume per unit of time. In the current embodiment, the airflow measurement 144 is expressed in cubic feet per minute (CFM). The air conditioning information 140 may also include a power consumption measurement 146 that is indicative of the power use of the HVAC unit 102 at a particular moment in time. Specifically, the power consumption measurement 146 of the HVAC unit 102 is expressed as units of power or energy per unit of time. In the current embodiment, the power consumption measurement is expressed in watts (W). As mentioned above, the power consumption measurement 146 may be obtained from an instantaneous energy meter reading.

As mentioned above, FIG. 7 also includes results of analyzing the air conditioning information 140. Particularly, a power consumption 148 of each unit 104, or output, is calculated based on the air conditioning information 140. To determine the power consumption 148, the metering system 125 first determines an airflow percentage 150 of each airflow measurement 144 relative to a total airflow 152 of the airflow measurements 144 for all of the units 104. In other words, each airflow measurement 144 is calculated as a percentage (airflow percentage 150) of the sum total airflow (total airflow 152) for each of the units 104. In some embodiments, the total airflow 152 may be measured by an airflow meter configured to measure the output of conditioned air from the HVAC unit. After calculating the airflow percentage 150 for each unit 104, the metering system 125 may determine the power consumption 148 of each unit 104 by comparing each airflow percentage 150 to the power consumption measurement 146. Specifically, the metering system 125 may multiply the airflow percentage 150 for each unit 104 by the power consumption measurement 146 to yield the calculated power consumption 148 for each unit 104.

Also, as mentioned above, the air conditioning information 140 represented in FIG. 7 is an example of a single data point of measurements that the metering system 125 may receive from the energy meter 112 and each airflow meter 114 at a single point in time. However, it should be noted that the energy meter 112 and each airflow meter 114 may continuously measure power consumption of the HVAC unit 102 and airflow of each VAV box 106, respectively. In such embodiments, the metering system 125 may receive the measurements at predetermined time intervals. For example, the metering system 125 may receive measurements every 1 second, 5 seconds, 10 seconds, 30 seconds, 1 minute, 2 minutes, 5 minutes, or any combination thereof, from the energy meter 112 and each airflow meter 114. In certain embodiments, the energy meter 112 and each airflow meter 114 may measure the power consumption of the HVAC unit 102 and airflow of each VAV box 106, respectively, at predetermined time intervals. For example, in some embodiments, the energy meter 112 and each airflow meter 114 may obtain measurements every 1 second, 5 seconds, 10 seconds, 30 seconds, 1 minute, 2 minutes, 5 minutes, or any combination thereof. In such embodiments, the metering system 125 may receive every measurement that the energy meter 112 and each airflow meter 114 obtains. The metering system 125 may then calculate the power consumption 148 for each unit 104 with every set of power consumption measurement 146 and airflow measurements 144 that the metering system 125 receives.

Figure 8:
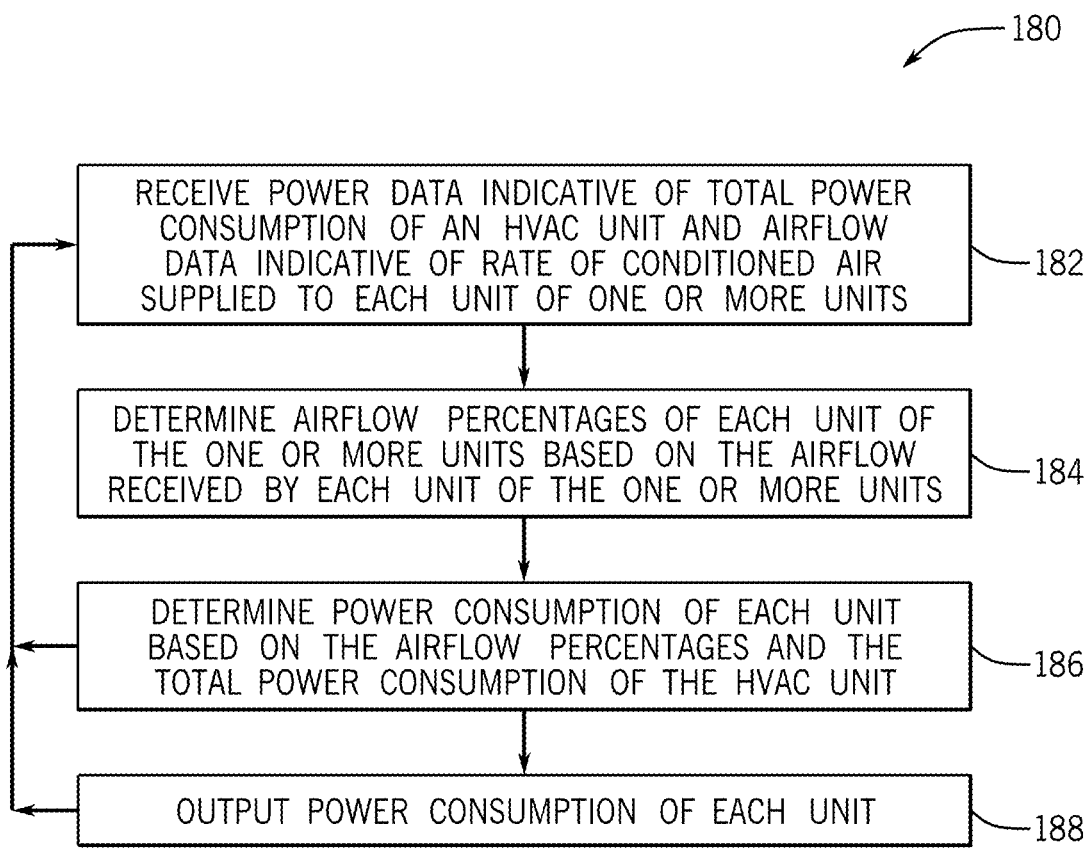
FIG. 8 is a flow chart of a process that may be utilized by the control system of FIG. 6 to determine power consumption, in accordance with an embodiment of the present disclosure.

FIG. 8 is a flowchart 180 illustrating a method for determining power consumption of each unit 104 of the building 100. At block 182, the metering system 125 receives power data indicative of the total power consumption of the HVAC unit 102 as well as airflow data indicative of airflow received by each unit 104 of the building 100. As discussed above, in some embodiments, the power data and the airflow data may be continuously monitored by the energy meter 112 and the airflow meters 114 and periodically received by, or transmitted to, the metering system 125. Further, in some embodiments, the power data and the airflow data may be periodically measured by the energy meter 112 and the airflow meters 114 and every set of power data and airflow data is periodically received by, or transmitted to, the metering system 125.

At block 184, the metering system 125 may determine airflow percentages of each unit 104 of the building 100 based on the airflow data. Specifically, the metering system 125 may divide the airflow measurement received by each unit 104 by a total airflow measurement received by all of the units 104, the measurement of which may summed from the data received from the units 104 or may be received from the HVAC unit 102, to determine a percentage of airflow received by each unit 104 relative to the total airflow received by all of the units 104 and output by the HVAC unit 102. Indeed, the total airflow received by all of the units 104 may be substantially equivalent to the total airflow output of the HVAC unit 102.

At block 186, the metering system 125 may determine the power consumption of each unit 104 based on the calculated airflow percentages and the power consumption of the HVAC unit 102. Particularly, the metering system 125 may multiply the airflow percentages for each unit 104 by the total power consumption of the HVAC unit 102 to yield the individualized power consumption for each unit 104 (e.g., the power consumption 148).

Further, it should be noted that the steps performed in blocks 182, 184, and 186 may be reiterated and performed at predetermined time intervals and/or with every new set of power data and airflow data received. At block 188, the metering system 125 produces an output of the power consumption of each unit 104 determined in blocks 182, 184, and 186. In some embodiments, the output may be in the form of a printout and/or may be in the form of an electronic visualization such as a display on a monitor. In certain embodiments, the output may be updated with each iteration of the steps performed in blocks 182, 184, and 186. For example, the output may include a representation of the power consumption of each unit 104 over a certain time period which may include multiple outputs of the iterations performed at blocks 182, 184, and 186. In other words, the output may include trends of power consumption for each unit 104.

In some embodiments, power consumptions for each unit 104 may be grouped according to one or more parameters or characteristics. For example, power consumption may be categorized based on ownership of the units 104. Specifically, a tenant of the building 100 may be responsible (e.g., owns or rents) for one or more of the units 104. For example, referring back to FIG. 5, a first tenant may be responsible for the units 104 labeled A1, A2, A3, and A4, a second tenant may be responsible for the units 104 labeled B1, B2, and B3, and a third tenant may be responsible for the units 104 labeled C1, C2, and C3. Accordingly, the power consumptions 148 for the units 104 may be grouped, or added, together according to tenant responsibility and expressed in the output as such. As mentioned above, the output may be a visualization of the calculated power consumptions 148. In other words, the power consumptions 148 may be expressed relative to a grouping of units 104, as opposed to being expressed relative to individual units 104. Particularly, in such embodiments, the power consumptions 148 for units 104 labeled A1, A2, A3, and A4 may be summed together in the output, the power consumptions 148 for the units 104 labeled B1, B2, and B3 may be summed together in the output, and the power consumptions 148 for the units 104 labeled C1, C2, and C3 may be summed together in the output. In some embodiments, the power consumptions 148 may be grouped according to a purpose of the unit 104, such as a purpose directed to maintaining a certain climate, such as for scientific sample preservation, food refrigeration, etc. It should also be noted that power consumption 148 may be grouped according to the one or more parameters at any point in determining the power consumption 148. For example, the airflow measurements 144 may be grouped together according to the one or more parameters before proceeding to calculate the airflow percentages 150.

Yet further, in some embodiments, the output may include an energy consumption of the units 104. Specifically, the calculated power consumptions 148 may be integrated with respect to time to yield energy use. In addition, the energy use for each unit 104 may be calculated based on a volume of airflow, or airflow over a time period, for each unit as compared to a measured energy use of the HVAC unit 102. For example, in such embodiments, the volume of airflow for each unit 104 may be obtained from integrating the airflow measurements 144 with respect to time. The volume of airflow for each unit 104 may then be calculated as a percentage of total volume of airflow from the HVAC unit 102, which was similarly obtained by integrating the total airflow 152 with respect to time. The percentages are then multiplied by the measured energy use of the HVAC unit 102 to yield the individual energy use for each unit 104. Calculating the energy use for the units 104 may be useful for billing purposes. For example, the energy use may be expressed in kilowatt-hours (kWh) or other common energy billing unit of measurement in the output. The energy use of the units 104 may also be categorized according to a parameter, such as tenant responsibility, climate, etc., as discussed above.

Accordingly, the present disclosure is directed to providing systems and methods for determining power consumption of one or more units of a building based on a relative airflow of conditioned air received from an HVAC unit. The power consumption of each unit of the one or more units may be a portion of the power consumed by the HVAC unit in supplying the conditioned air to each of the one or more units. In determining the power consumption of each unit, a single energy meter may be used. The measurements obtained from the energy meter may be compared to airflow measurements obtained from an airflow meter for each unit. In utilizing only a single energy meter to determine the power usage for all of the units, the system may save in various costs, such as costs for additional energy meters.

While only certain features and embodiments of the present disclosure have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the embodiments, all features of an actual implementation may not have been described (i.e., those unrelated to the presently contemplated best mode of carrying out the disclosure, or those unrelated to enabling the claimed features). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A heating, ventilation, and/or air conditioning (HVAC) system, comprising:

an HVAC unit configured to supply conditioned air to a duct system of the HVAC system and having an HVAC unit controller;
an energy meter configured to provide the HVAC unit controller with feedback indicative of power consumed by the HVAC unit;
a variable air volume (VAV) box coupled to the duct system and configured to supply the conditioned air to a unit of a building, wherein the VAV box includes a VAV box controller;
an airflow meter configured to provide the VAV box controller with additional feedback indicative of a of flow rate of the conditioned air supplied to the unit via the VAV box; and
a metering system having a supervisory controller communicatively coupled to the HVAC unit controller and the VAV box controller, wherein the supervisory controller is configured to receive the feedback and the additional feedback to determine an individualized power consumption for the unit based on the flow rate of the conditioned air supplied to the unit and the power consumed by the HVAC unit.

2. The HVAC system of claim 1, wherein the metering system is configured to determine an individualized energy consumption of the unit for a time interval by integrating the individualized power consumption of the unit over the time interval.

3. The HVAC system of claim 1, wherein the individualized power consumption of the unit is categorized according to a characteristic of the unit.

4. The HVAC system of claim 1, wherein the unit comprises multiple rooms of the building.

5. The HVAC system of claim 1, wherein the building comprises a plurality of units, and wherein the metering system is configured to determine a respective individualized power consumption for each unit of the plurality of units.

6. The HVAC system of claim 1, wherein the airflow meter is positioned within the VAV box.

7. The HVAC system of claim 1, wherein the supervisory controller is configured to receive the additional feedback from the VAV box controller via the HVAC unit controller.

8. The HVAC system of claim 7, wherein the VAV box controller is configured to transmit the additional feedback to the supervisory controller via the HVAC unit controller at predetermined time intervals, wherein the HVAC unit controller is configured to transmit the feedback to the supervisory controller at the predetermined time intervals, and wherein the supervisory controller is configured to determine the individualized power consumption for the unit at the predetermined time intervals based on the additional feedback and the feedback.

9. The HVAC system of claim 1, wherein the supervisory controller is coupled to the VAV box controller and the HVAC unit controller via an Ethernet connection.

10. The HVAC system of claim 1, wherein the supervisory controller, the HVAC unit controller, and the VAV box controller are commutatively coupled to one another in series, wherein the VAV box controller is configured to transmit the additional feedback indicative of the flow rate of the conditioned air to the HVAC unit controller, and the HVAC unit controller is configured to transmit the additional feedback and the feedback indicative of the power consumed by the HVAC unit to the supervisory controller.

11. The HVAC system of claim 10, wherein the VAV box controller is one of a plurality of VAV box controllers associated with a plurality of VAV boxes, wherein each VAV box controller of the plurality of VAV box controllers is configured to provide the HVAC unit controller with respective feedback indicative of a flow rate of conditioned air discharged by a corresponding VAV box of the plurality of VAV boxes.

12. A method for determining power consumption of a unit of a heating, ventilation, and/or air conditioning (HVAC) system, comprising:
providing conditioned air to a duct system of the HVAC system via an HVAC unit of the HVAC system;
supplying the conditioned air to a unit of a building via a variable air volume (VAV) box coupled to the duct system;
receiving, at an HVAC unit controller of the HVAC unit, feedback indicative of a total power consumed by the HVAC unit;
receiving, at a VAV box controller of the VAV box, additional feedback indicative of a flow rate of the conditioned air discharged from the VAV box into the unit from the HVAC unit;
receiving, at a supervisory controller of the HVAC system, the feedback and the additional feedback to determine a power consumption of the unit based on the total power consumed by the HVAC unit and the flow rate of the conditioned air; and
outputting the power consumption of the unit.

13. The method of claim 12, wherein determining the power consumption of the unit comprises:
determining a percentage of a total conditioned air flow output by the HVAC unit that is received by the unit, wherein the HVAC unit supplies the total conditioned air flow to the building.

14. The method of claim 13, wherein determining the power consumption of the unit comprises:
multiplying the percentage by the total power consumed by the HVAC unit.

15. The method of claim 12, wherein the power consumption of the unit is determined at predetermined time intervals.

16. The method of claim 12, wherein outputting the power consumption of the unit comprises printing the power consumption and/or displaying the power consumption.

17. The method of claim 12, comprising:
determining an energy consumption of the unit for a time interval by integrating, via the supervisory controller, the power consumption of the unit over the time interval.

18. The method of claim 12, further comprising:
transmitting, via the VAV box controller, the additional feedback indicative of the flow rate of the conditioned air to the HVAC unit controller; and
transmitting, via the HVAC unit controller, the additional feedback and the feedback indicative of the power consumed by the HVAC unit to the supervisory controller, wherein the supervisory controller, the HVAC unit controller, and the VAV box controller are communicatively coupled to one another in series.

19. A heating, ventilation, and/or air conditioning (HVAC) system, comprising:
an HVAC unit configured to supply conditioned air to a duct system of the HVAC system and having an HVAC unit controller;
an energy meter configured to provide the HVAC unit controller with feedback indicative of power consumed by the HVAC unit;

a variable air volume (VAV) box coupled to the duct system and configured to supply the conditioned air to a unit of a building, wherein the VAV box includes a VAV box controller;

an airflow meter configured to provide the VAV box controller with additional feedback indicative of a flow rate of the conditioned air supplied to the unit via the VAV box; and a metering system configured to determine a power consumption of the unit, wherein the metering system comprises:

a supervisory controller having a processor; and a non-transitory, computer-readable media having executable instructions stored thereon, the executable instructions comprising instructions configured to receive the feedback and the additional feedback and to determine the power consumption of the unit based on the flow rate of the conditioned air supplied to the unit and the power consumed by the HVAC unit.

20. The HVAC system of claim 19, wherein the VAV box is coupled to the airflow meter.

21. The HVAC system of claim 19, wherein the metering system is configured to determine the power consumption of the unit at predetermined time intervals.

22. The HVAC system of claim 19, wherein the power consumption of the unit is based on an associated percentage of the conditioned air received by the unit relative to a total amount of conditioned air provided to the building via the HVAC unit.

23. The HVAC system of claim 19, wherein the power consumption of the unit is calculated as a portion of the power consumed by the HVAC unit.

24. The HVAC system of claim 19, wherein the processor is configured to determine an energy consumption of the unit over a time interval by integrating the power consumption over the time interval.

* * * * *